United States Patent [19]
Chang

[11] Patent Number: 5,686,777
[45] Date of Patent: Nov. 11, 1997

[54] HIGH ACCURACY PIEZOELECTRIC POSITIONING DEVICE

[75] Inventor: Timothy N. Chang, Pompton Plains, N.J.

[73] Assignee: New Jersey Institute of Technology, Newark, N.J.

[21] Appl. No.: 531,762

[22] Filed: Sep. 21, 1995

[51] Int. Cl.⁶ .................................................. H01L 41/08
[52] U.S. Cl. ........................ 310/326; 310/316; 310/328; 310/358; 356/350
[58] Field of Search ....................................... 310/316, 317, 310/319, 326, 323, 366, 328, 358

[56] References Cited

U.S. PATENT DOCUMENTS

| | | | |
|---|---|---|---|
| 3,684,904 | 8/1972 | Galutva et al. | 310/328 |
| 4,240,003 | 12/1980 | Larson, III | 310/326 |
| 4,384,230 | 5/1983 | Wisner | 310/317 |
| 4,454,441 | 6/1984 | Taniguchi | 310/328 |
| 4,641,052 | 2/1987 | Kobayashi | 310/317 |
| 4,653,919 | 3/1987 | Stjen et al. | 356/350 |
| 5,450,198 | 9/1995 | Killpatrick et al. | 356/350 |
| 5,557,156 | 9/1996 | Elings | 310/316 |

*Primary Examiner*—Mark O. Budd
*Attorney, Agent, or Firm*—Klauber & Jackson

[57] ABSTRACT

An apparatus and method for utilizing piezoelectric devices for precise positioning purposes without having to endure the detrimental effects of hysteresis. The apparatus and method involving driving a pair of piezoelectric stacks with complementary low amplitude, high frequency dither signals produced by an oscillating source. The complementary low amplitude, high frequency dither arrangement, referred to as an intermediate dither, is self-compensating so that no residual dither is transmitted to a load attached to one of the stacks. Furthermore, the dithering of each stack results in a virtual elimination of hysteresis in the material of the piezoelectric stacks.

26 Claims, 11 Drawing Sheets

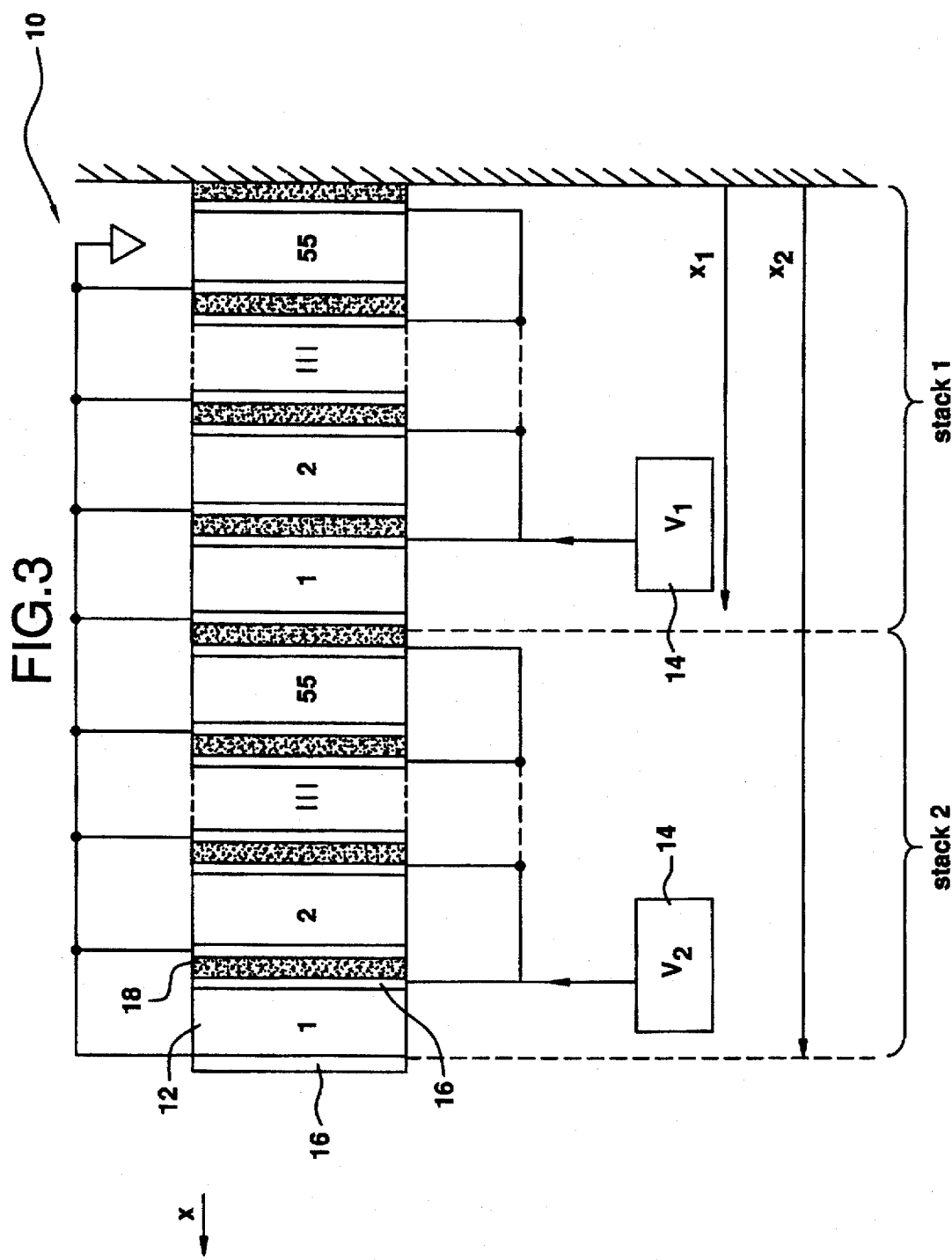

HIGH ACCURACY PIEZOELECTRIC POSITIONING DEVICE

FIELD OF THE INVENTION

The present invention relates to piezoelectric devices and, more particularly, to a high accuracy piezoelectric positioning device that overcomes the detrimental effects of hysteresis.

DESCRIPTION OF THE PRIOR ART

Piezoelectric devices have long been used as motioning and/or positioning devices for a variety of purposes. For instance, piezoelectric devices have been used to position a tool or a corresponding workpiece with respect to one another. Also, piezoelectric devices have been used to position optoelectronic components so as to insure a consistent optical beam path.

Despite the numerous uses available for piezoelectric devices for positioning purposes, there is one inherent disadvantage to using piezoelectric devices for precise positioning purposes. This disadvantage is that piezoelectric materials exhibit hysteresis similar to that of magnetic materials. That is, the domain of all piezoelectric materials have a finite memory of their immediate previous operating conditions so that when a new stimulus is applied thereto the output of the piezoelectric material will be a function of the input as well as the previous state. Consequently, it has not been previously feasible to use piezoelectric devices for precise positioning purposes. Thus, it would be desirable to provide a means or a method for utilizing piezoelectric devices for precise positioning purposes without having to endure the detrimental effects of hysteresis.

Several patents have been issued which disclose piezoelectric devices being used for various types of positioning purposes. For example, U.S. Pat. Nos. 4,384,230 by Wisner, 4,454,441 by Taniguchi, 3,684,904 by Galutva et al., and 4,641,052 by Kobayashi are all directed toward piezoelectric devices and related uses thereof. A brief description of these patents will now be given.

In U.S. Pat. No. 4,384,230, Wisner discloses a linear extension piezoelectric actuator having a plurality of discrete groups of piezoelectric material segments disposed coaxially along the extension axis of the actuator. Each group of piezoelectric material segments is separately energized in a bistable manner by a voltage signal having an alternating extended state and quiescent state magnitude so that the actual value of extension is independent of the effects of hysteresis. It should be noted that this patent fails to disclose energizing the groups of piezoelectric material segments with low amplitude, high frequency signals but instead discloses energizing the same with high and low voltage signals. Also, this patent fails to account for the existence of minor loops.

In U.S. Pat. No. 4,454,441, Taniguchi discloses a piezoelectric driving apparatus comprising a plurality of piezoelectric blocks wherein each piezoelectric block may be individually energized so as to drive a fixed member which is mechanically engaged with the piezoelectric blocks. It should be noted that this patent fails to disclose any connection between individually energizing the piezoelectric blocks and the hysteresis associated with the piezoelectric material.

In U.S. Pat. No. 3,684,904, Galutva et al. disclose a device for precisely displacing a solid body comprising a plurality of piezoelectric transducers which are individually energized by signals of varying voltage so as to effect the movement of a solid body. It should be noted that this patent fails to disclose any connection between individually energizing the piezoelectric transducers and the hysteresis associated with the piezoelectric material. Also, it should be noted that the piezoelectric transducers are energized so as to effect the movement of the solid body in largely different directions.

In U.S. Pat. No. 4,641,052, Kobayashi discloses a circuit for use with stacked piezoelectric elements. The circuit prevents a failure of one or more of the piezoelectric elements in the stack from affecting the remaining piezoelectric elements in the stack. It should be noted that this patent fails to disclose energizing the piezoelectric elements in any manner with respect to displacing objects and the like. Also, it should be noted that this patent fails to mention the hysteresis associated with the piezoelectric material.

Although all of the above-mentioned patents are all directed toward piezoelectric devices and related uses thereof, none are directed toward providing a means or a method for utilizing piezoelectric devices for precise positioning purposes without having to endure the detrimental effects of hysteresis. Such a means or method would allow the otherwise versatile properties of piezoelectric materials to be utilized for precise positioning purposes.

SUMMARY OF THE INVENTION

The present invention contemplates a means and a method for utilizing piezoelectric devices for precise positioning purposes without having to endure the detrimental effects of hysteresis. The means comprises utilizing complementary piezoelectric stacks and driving each of the stacks with complementary low amplitude, high frequency dither signals produced by an oscillating source means. The complementary low amplitude, high frequency dither arrangement, hereinafter referred to as an intermediate dither, is self-compensating so that no residual dither is transmitted to a load attached to one of the stacks. Furthermore, the dithering of each stack results in a virtual elimination of hysteresis in the material of the piezoelectric stacks.

The method comprises driving a pair of complementary piezoelectric stacks with complementary low amplitude, high frequency dither signals produced by an oscillating source means. Again, the complementary low amplitude, high frequency dither arrangement (the intermediate dither) is self-compensating so that no residual dither is transmitted to a load attached to one of the stacks. Furthermore, the dithering of each stack results in a virtual elimination of hysteresis in the material of the piezoelectric stacks.

From the above descriptive summary it is apparent how the present invention means and method overcome the shortcomings of the above-mentioned prior art.

Accordingly, the primary objective of the present invention is to provide a means and a method for utilizing piezoelectric devices for precise positioning purposes without having to endure the detrimental effects of hysteresis.

Other objectives and advantages of the present invention will become apparent to those skilled in the art upon reading the following detailed description and claims, in conjunction with the accompanying drawings which are appended hereto.

BRIEF DESCRIPTION OF THE DRAWINGS

In order to facilitate a fuller understanding of the present invention, reference is now be made to the appended drawings. The drawings should not be construed as limiting the present invention, but are intended to be exemplary only.

FIG. 2b is a graph showing induced multiloop hysteresis in a piezoelectric material resulting from the application of the input signal shown in FIG. 2a.

FIG. 3 is a schematic representation of a device that realizes the present invention means and method of intermediate dither.

FIG. 5b is a graph showing three hysteresis loops generated in a PZT stack from the position command signal shown in FIG. 5a.

DETAILED DESCRIPTION OF THE PRESENT INVENTION

Description of Hysteresis Force

Figure 1A:
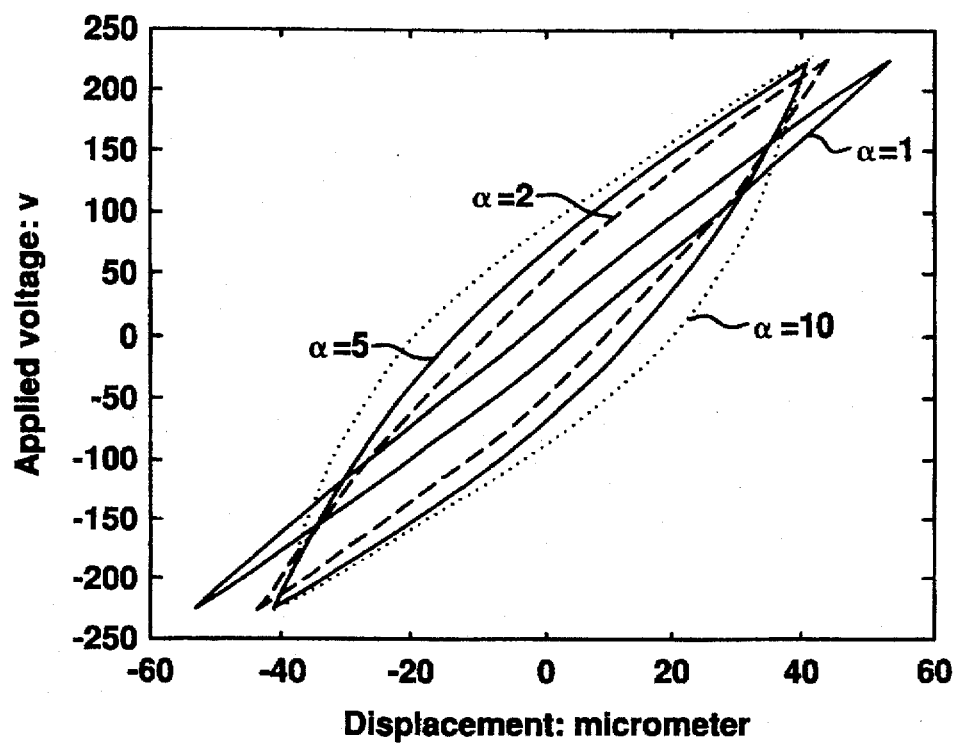
FIG. 1a is a graph showing hysteresis loops for piezoelectric materials having σ=1, 2, 5, and 10.
Figure 1B:
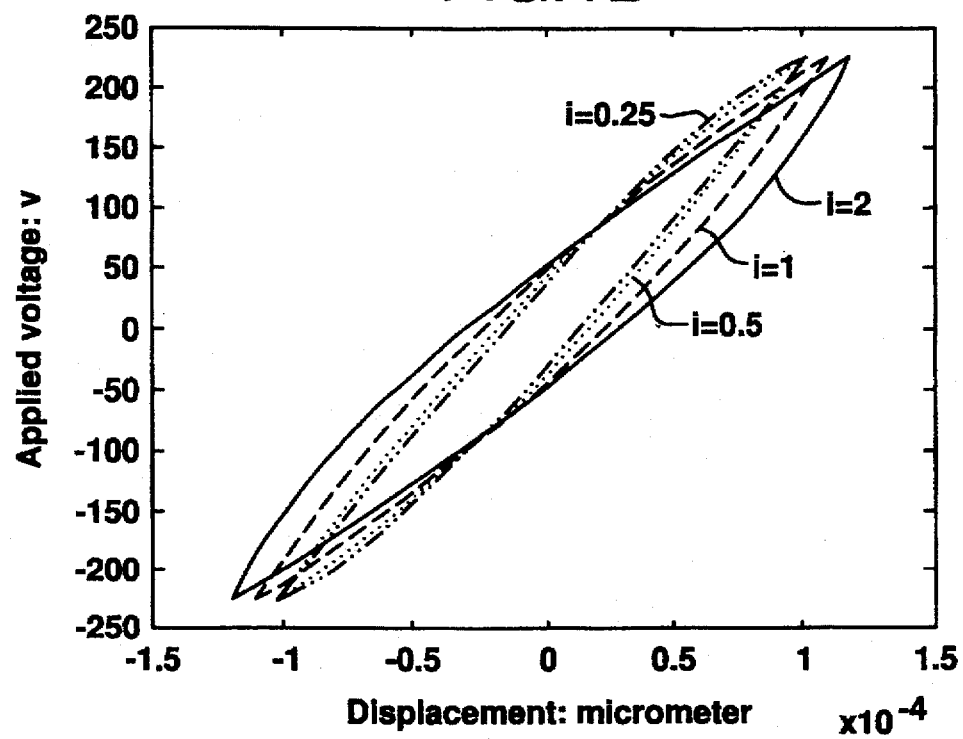
FIG. 1b is a graph showing hysteresis loops for piezoelectric materials having i=0.25, 0.5, 1, and 2.

It is well known that the displacement-voltage relation of most piezoelectric materials, such as lead zirconate—lead titanate (PZT), is nonlinear with various degrees of hysteresis described by the following nonlinear differential equations:

$$\frac{dF}{dt} = \frac{dF}{dx} \cdot \frac{dx}{dt} \tag{1}$$

wherein $$\frac{dF}{dx} = \sigma \left| 1 - \frac{F}{F_c} SGN(\dot{x}) \right|^i SGN\left(1 - \frac{F}{F_c} SGN(\dot{x})\right) \tag{2}$$

wherein SGN is the sign function:

$$SGN(X) = \begin{cases} 1 \text{ for } x \geq 0 \\ -1 \text{ for } x < 0 \end{cases} \tag{3}$$

and F is a solid friction force which is a function of a displacement x and a velocity $\dot{x}$. $F_c$ is a Coulomb friction force which can also be thought of as a "yield force" or as a "running friction force" (for example, as found in a bearing friction). The coefficient σ is the rest stiffness or the slope of a force deflection curve at F=0. The variable i is a parameter dependent upon the type of piezoelectric material: for a ductile type, i=1, 2; for a brittle type, i=0, ¼, ½. Some typical hysteresis loops are plotted in FIGS. 1a and 1b.

For most PZT materials σ=1, i=1, and (2) can be simplified to:

$$\frac{dF}{dx} = 1 - \frac{F}{F_c} SGN(\dot{x}) \tag{4}$$

Furthermore, the phenomenon of minor, off-axis hysteresis loops existing within a main hysteresis loop is also common. A minor, off-axis hysteresis loop may start from an arbitrary point on the curve of a major hysteresis loop and terminate at the starting point as described by the following equations:

$$\frac{dF}{dx} = 2 - \frac{F - FEX(K)}{F_c} SGN(\dot{x}) \tag{5}$$

wherein K=K+1 is set at a $K^{th}$ turnaround point defined as $\dot{x}$ undergoes a sign change, and wherein FEX(K)=F is a hysteresis force at the time of the $K^{th}$ turnaround after K is set. The initial conditions are: K=1 and FEX(1)=−$F_c$+SGN($\dot{x}$(0)) wherein $F_c$ is a hysteresis force at an initial loading point. Moreover, 1.) if K>2 and |F−FEX(K)|≧|FEX(K)−FEX(K−1)|, then K is reset to K−2 and 2.) if K=2 and |F|≧$F_c$, then K is reset to K=1 and FEX(1)=−$F_c$SGN($\dot{x}$).

Figure 2A:
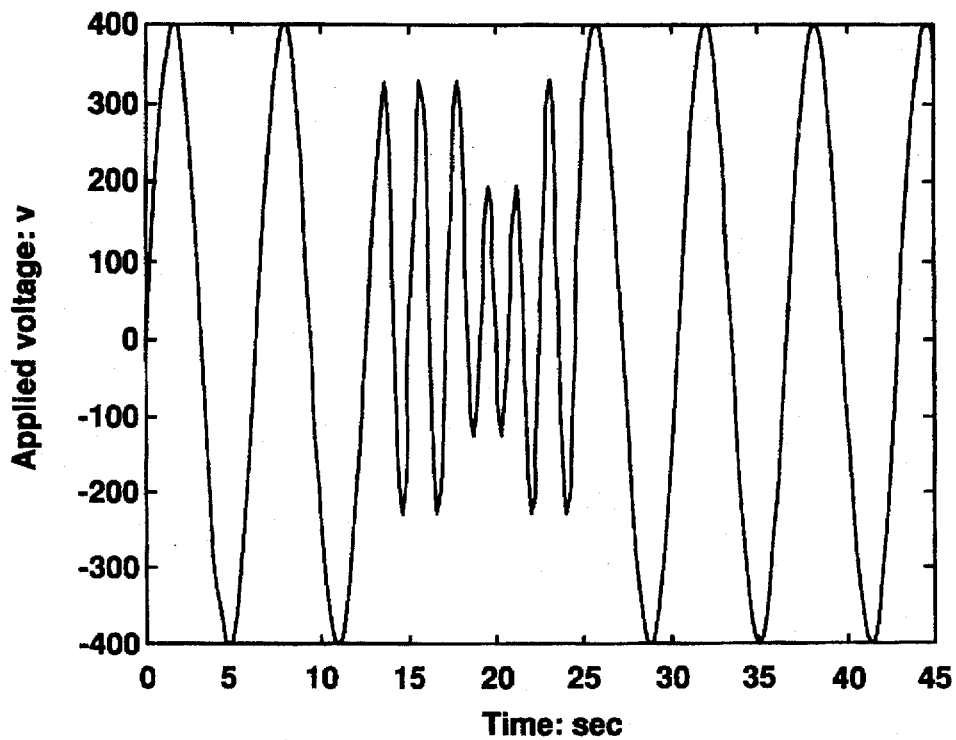
FIG. 2a is a graph showing a waveform of an input signal that will induce multiloop hysteresis in a piezoelectric material.
Figure 2B:
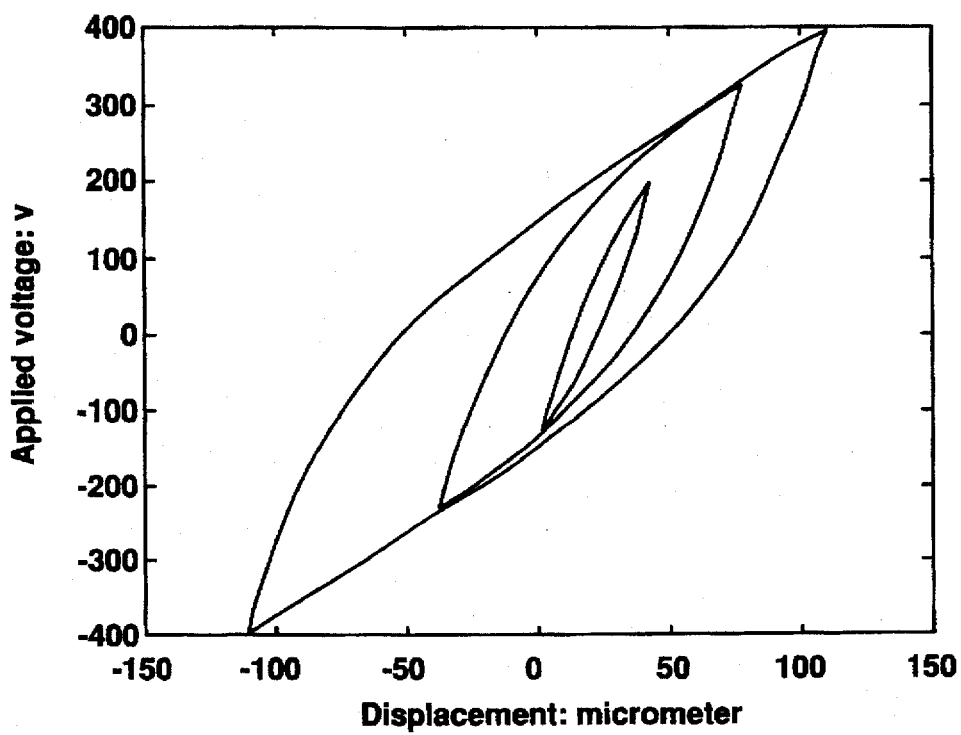
Figure 4B:
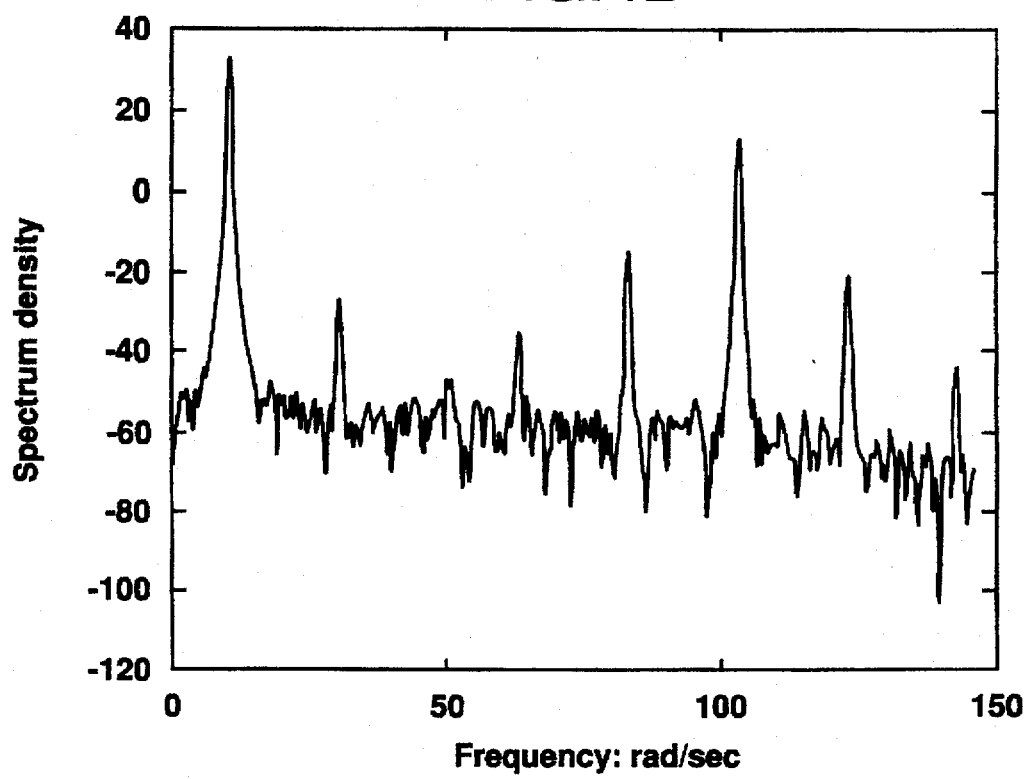
FIG. 4b is a graph showing the spectral density of the stack motion of a PZT stack having a dither signal with an amplitude of A=50 V applied thereto.
Figure 4A:
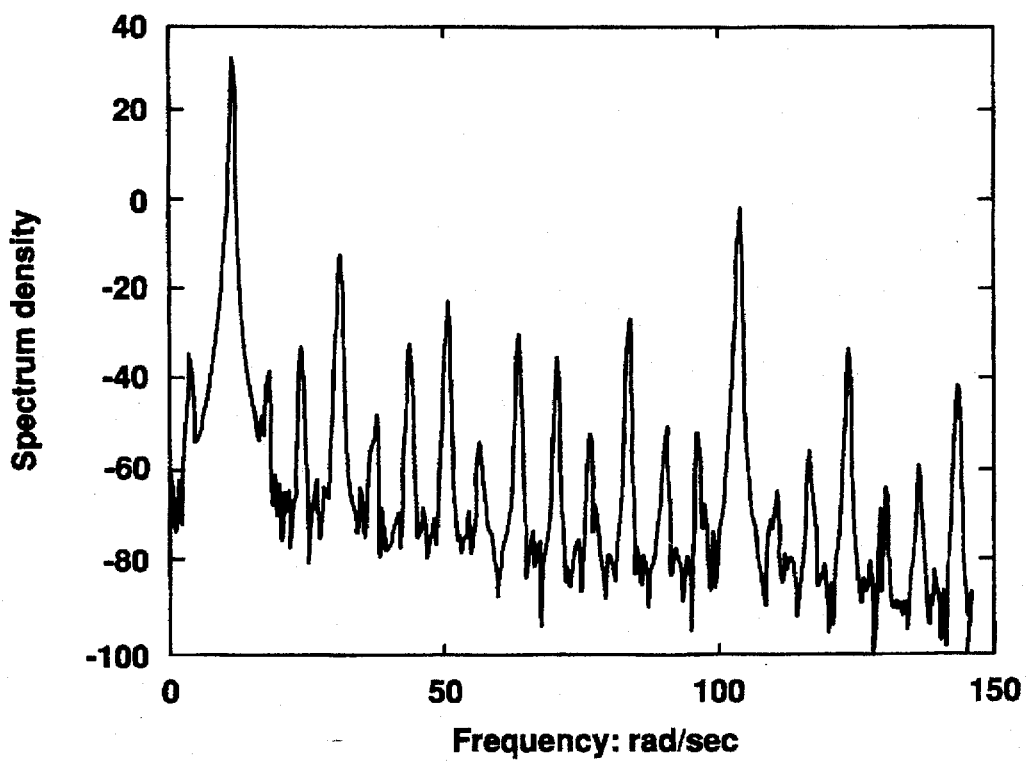
FIG. 4a is a graph showing the spectral density of the stack motion of a PZT stack having a dither signal with an amplitude of A=10 V applied thereto.
Figure 4C:
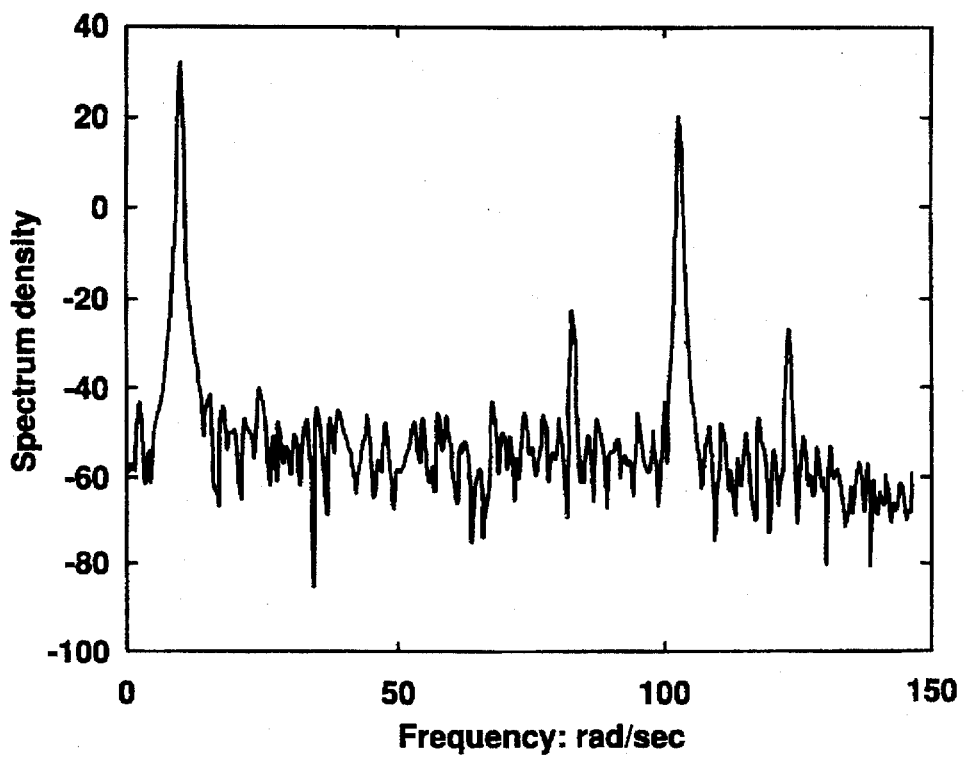
FIG. 4c is a graph showing the spectral density of the stack motion of a PZT stack having a dither signal with an amplitude of A=100 V applied thereto.
Figure 4D:
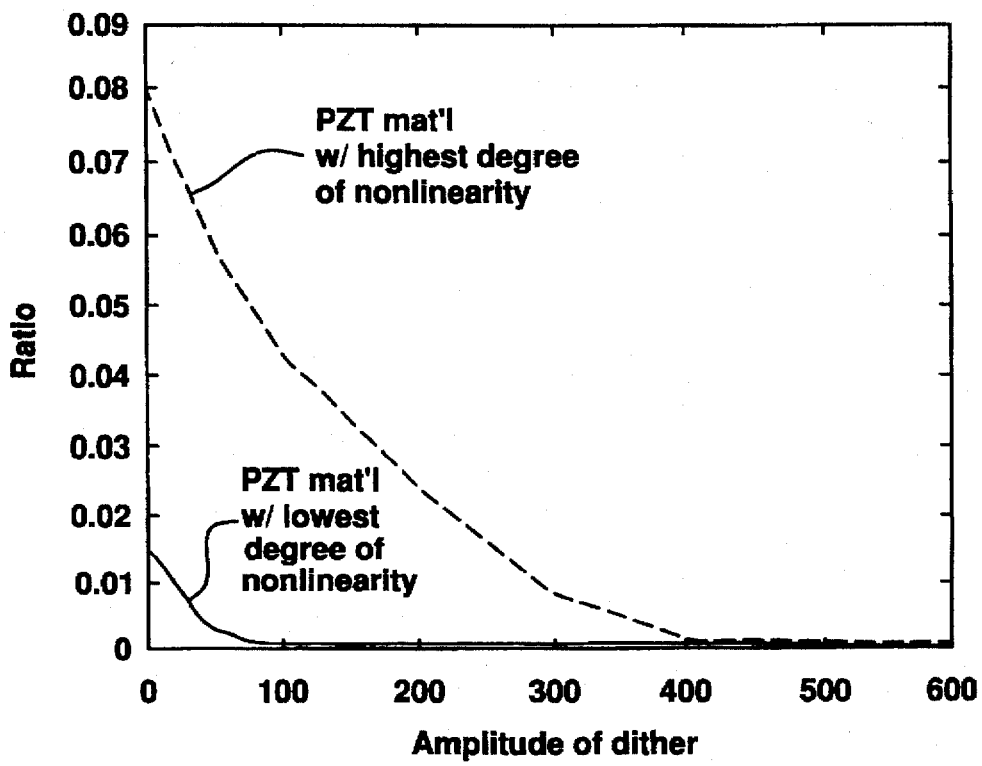
FIG. 4d is a graph showing the ratio between higher order harmonics and the fundamental harmonic for PZT materials having the highest and the lowest degrees of nonlinearity.

FIGS. 2a and 2b illustrate the phenomenon of minor loops.

Description of Typical Device

A device (10) that realizes the present invention method of intermediate dither can be constructed by joining two PZT piezoelectric stacks (i.e. stacks 1 and 2) together as shown in FIG. 3. For example, each PZT stack comprises 55 PZT discs (12) wired in parallel to a drive voltage means (14). Thus, each stack comprises 55 PZT discs (12), each sandwiched between a pair of silver electrodes (16) and separated from each other by a non-conductive glue joint (18). Each disc (12) is typically 1.17 cm in diameter and 0.18 cm in thickness.

The equations of motion of the stack are given by:

$$\ddot{x}_i = \frac{F_{Ai}}{M_i} \tag{6}$$

wherein $M_i$ is the load mass of the i-th stack (i=1, 2), $V_i$ is the voltage applied to the i-th stack (i=1, 2), $x_i$ is the i-th stack end displacement (i=1, 2), b is ratio of the glue joint thickness to the disc thickness (b≈0), N is the number of discs in PZT stack (N=55), A is the surface area of one side of one of the discs in the PZT stack ($A \approx 4.30 \times 10^4 \, m^2$), $d_{33}$ is the piezoelectric material strain per electric field coefficient ($d_{33} \approx 500 \times 10^{-12}$ m/v), $S_{33}$ is the piezoelectric material strain per stress coefficient ($S_{33} \approx 20.8 \times 10^{-12} \, m^2/N$), H is the stack height (H≈10 cm), $F_{Ai}$ is the accelerating force on the load mass, and $\gamma$ is the damping coefficient.

The overall equation is:

$$F_{Ai} = K_V V - \gamma \dot{x} - K_N x - K_i F \tag{8}$$

wherein $$K_V = \frac{NA(1+b)d_{33}}{HS_{33}} \tag{9}$$

and $$K_N = \frac{A}{HS_{33}} \tag{10}$$

and wherein $K_V$ and $K_N$ are, respectively, the voltage-force scale factor and the equivalent spring rate. $K_V$ and $K_N$ are determined by the type and the shape of the ceramic materials. For this particular PZT system, $$K_V = \frac{NA(1+b)d_{33}}{HS_{33}} \approx 5.8300 \, \frac{N}{V} \tag{11}$$

$$K_N = \frac{A}{HS_{33}} \approx 2.01944 \times 10^8 \, \frac{N}{m} \tag{12}$$

Description of Dither Formation

A dither is a high frequency oscillation introduced into a nonlinear system in order to improve its performance. The dither frequency is arbitrary but it is chosen at least a decade above the bandwidth of a position command signal (which controls the desired motion of the stack) so that the two signals can be readily separated by, for example, electronic filtering. It is well known that a suitably applied dither effectively linearizes a nonlinearity. However, past work on dither-linearization focused on dead zone and saturation. The present invention contemplates the application of dither to linearize multi-loop hysteresis.

To illustrate the effects of dither, consider the injection of a low frequency probing signal (400 sin 10t) to a PZT stack actuator along with a dither (A sin 103t). For a linear system, the spectrum of the stack motion ($x_i$) should consist of only the input frequency components (i.e. at 10 and 103 rad/s). For a nonlinear system, the output spectrum consists of numerous harmonics due to the presence of the hysteresis force.

The effects of nonlinearity suppression are shown in FIG. 4. It is readily observed, from FIGS. 4a to 4c, that the spectral power of the higher order harmonic decreases as the amplitude (A) of the dither increases. FIG. 4d illustrates the ratio between higher order harmonics and the fundamental harmonic for PZT materials having the highest and the lowest degrees of nonlinearity.

Figure 5A:
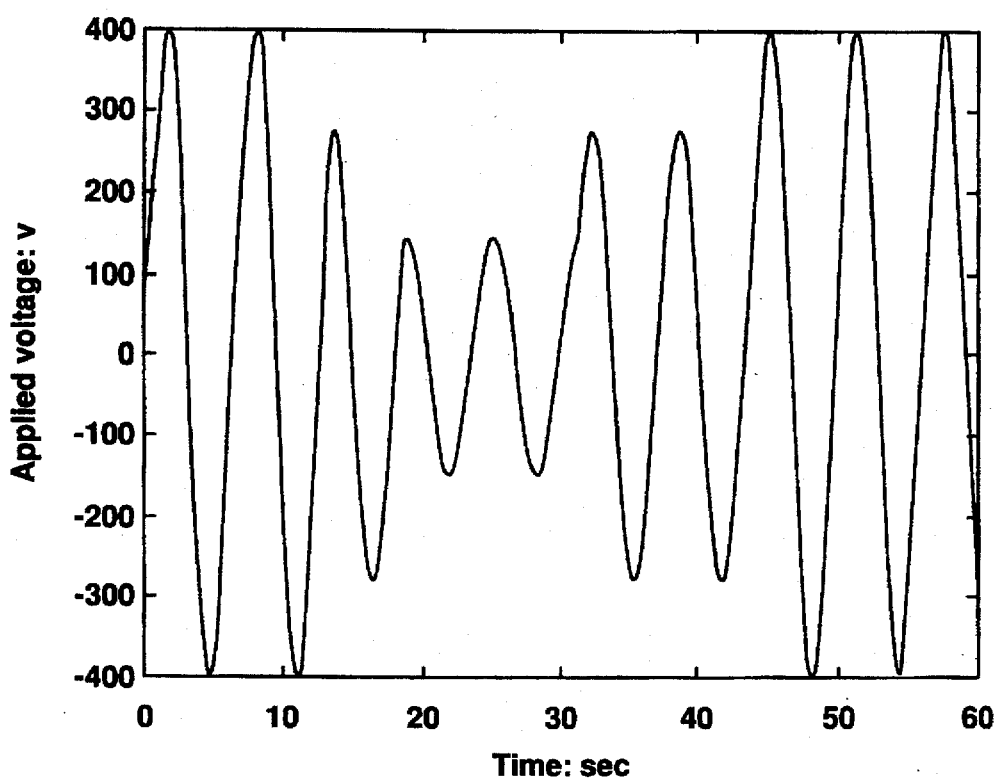
FIG. 5a is a graph showing a position command signal for a PZT stack.
Figure 5B:
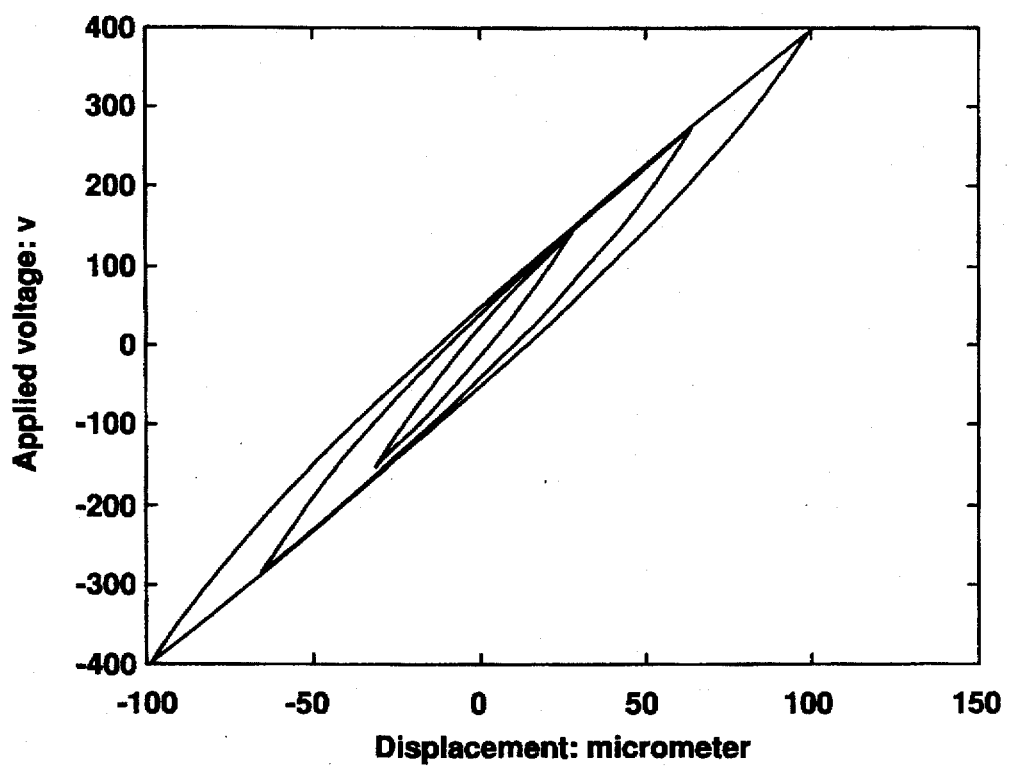
Figure 5C:
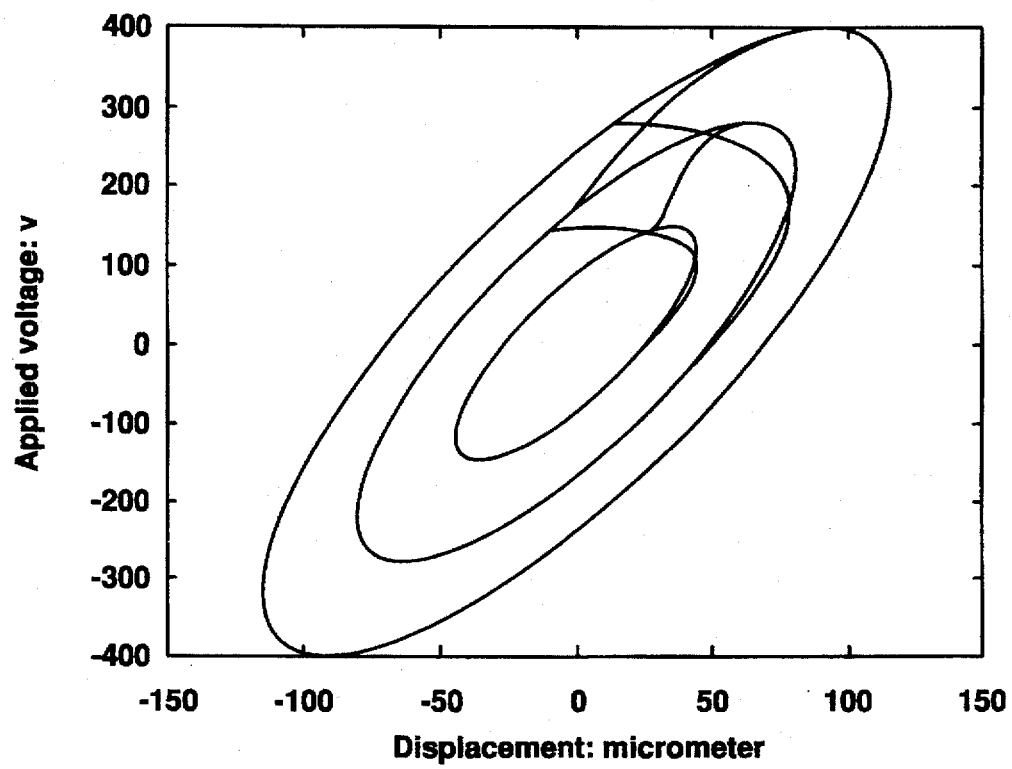
FIG. 5c is a graph showing the baseband response of a dither-linearized system.
Figure 5D:
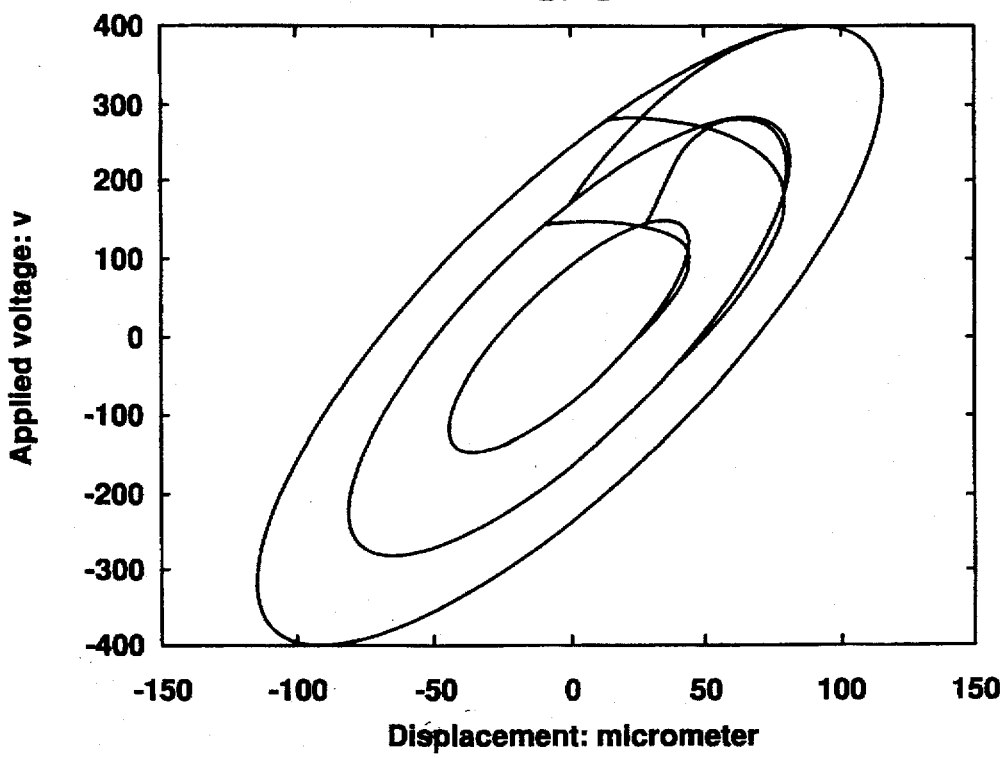
FIG. 5d is a graph showing the baseband response of an ideal linear system (i.e. with zero hysteresis force).

Similarly, FIGS. 5a through 5d illustrate the annihilation of minor, off-axis hysteresis loops. A position command signal is a composite sine wave as shown in FIG. 5a. For a PZT stack, this input signal effectively generates three hysteresis loops: one major loop and two minor off-axis loops as shown in FIG. 5b. The baseband response of the dither-linearized system is shown in FIG. 5c, which is almost the same as that of an ideal linear system (with zero hysteresis force) such as shown in FIG. 5d. It is further observed that the undesired off-axis "memory" has been neutralized by the dither. The minor, off-axis hysteresis loops now become ellipses that are symmetrical to the origin with the presence of the dither.

Description of Preferred Embodiments

Figure 6A:
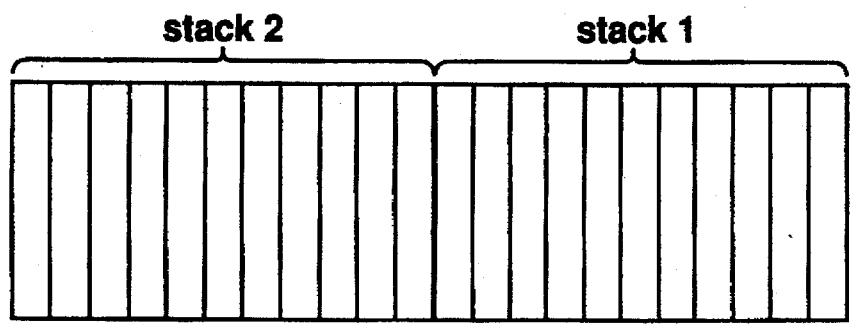
FIG. 6a is a sketch of a pair of piezoelectric stacks joined end to end in a quiescent state.
Figure 6B:
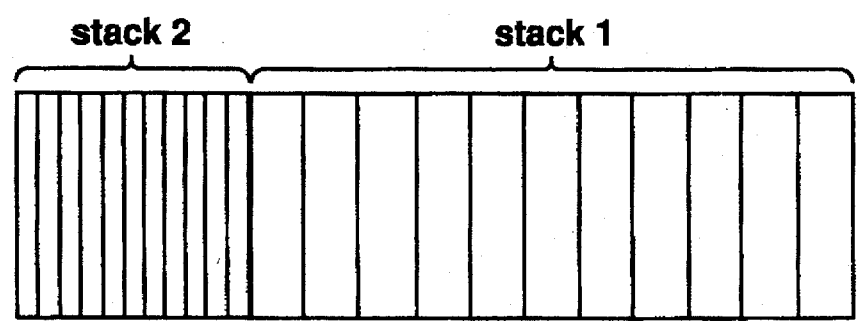
FIG. 6b is a sketch of the pair of piezoelectric stacks shown in FIG. 6a in a dithering state wherein stack 1 is expanded while stack 2 is contracted.
Figure 6C:
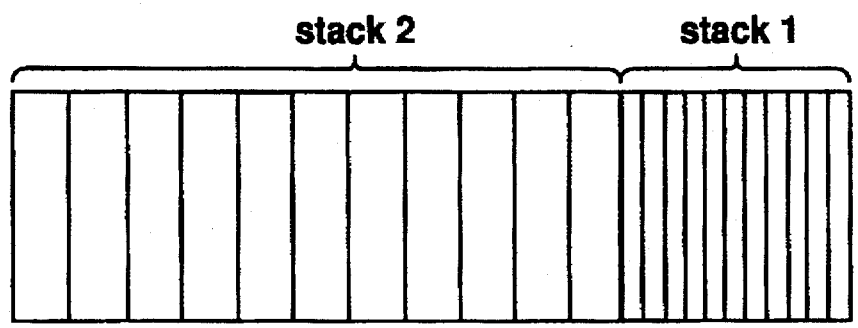
FIG. 6c is a sketch of the pair of piezoelectric stacks shown in FIG. 6a in a dithering state wherein stack 1 is contracted while stack 2 is expanded.

Although dither is highly effective in linearizing the PZT materials, the direct use of dither in high accuracy applications is, however, not feasible due to the transmission of the dither motion to the end point (load). This consideration motivates the use of an "intermediate dither" where two adjoining PZT stacks are dithered in a compensating manner so that no residual dither is transmitted to the load. This intermediate dither motion is shown in FIGS. 6a through 6c wherein stacks 1 and 2 are controlled to dither in such a compensating manner that the total length of the two stacks is constant. A position command motion is then applied in addition to the dither signals. From the command signal entry point, the PZT system is completely linear and capable of ultra-high accuracy output.

Precise control of the stack motion can be achieved in many ways, including a master-slave mode and an interconnected mode. These modes are now described.

Master-Slave Mode

Figure 7:
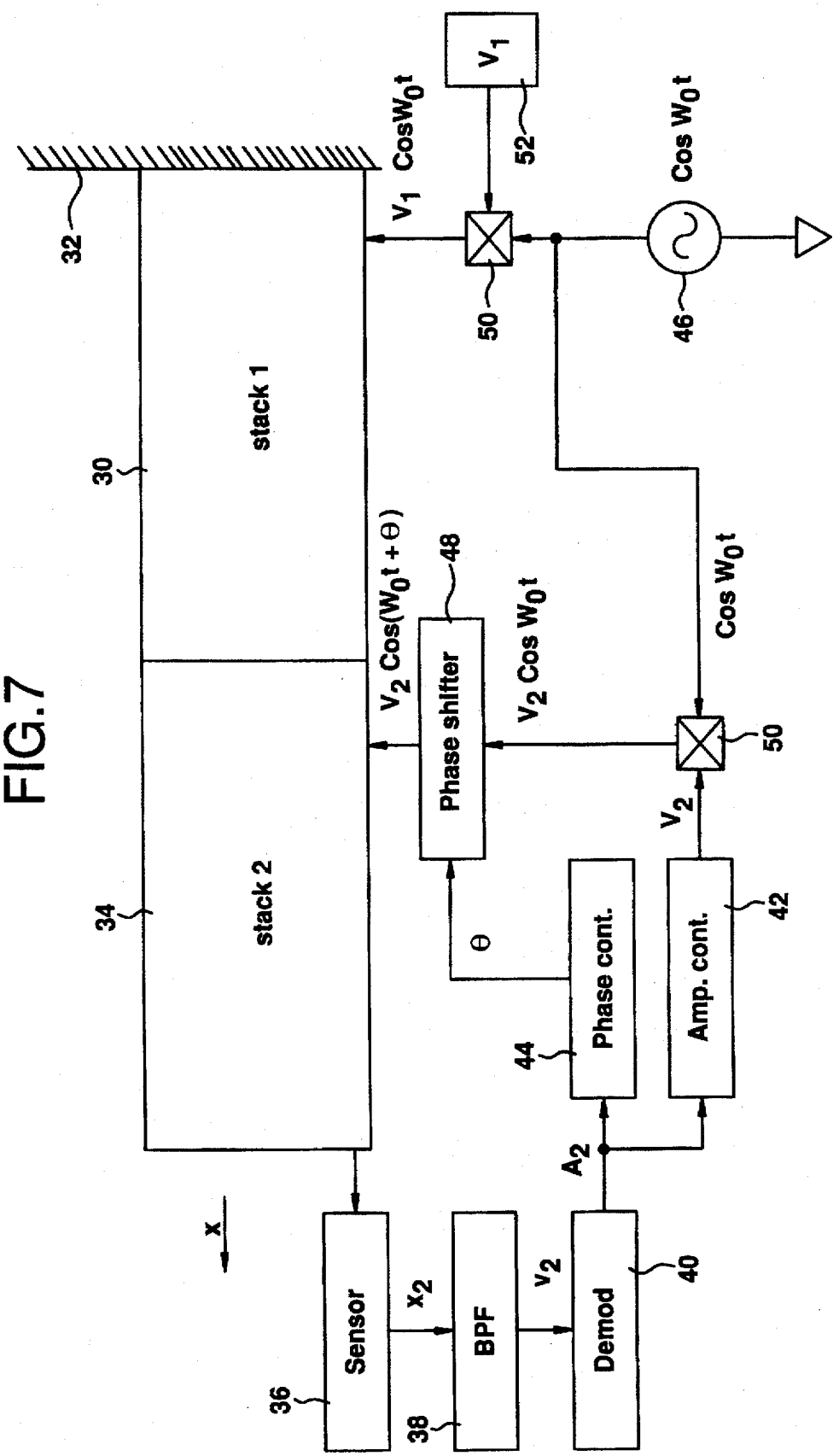
FIG. 7 is a schematic representation of a master-slave mode embodiment for controlling dither in a pair of adjoining stacks according to the present invention.

Referring to FIG. 7, a sinusoidal drive signal ($V_1 \cos \omega_0 t$) with predetermined amplitude and frequency is applied, on an open loop basis, to a first dither stack 30 mounted to a support 32. A second dither stack 34 has a sensor 36 attached thereto which monitors any transmitted dither motion ($x_2$). The motion output ($x_2$) of the sensor 36 is filtered by a bandpass filter 38 (or a bandpass demodulator) to extract the $\omega_o$ dither component while rejecting all low frequency position command motion. The output of the bandpass filter is denoted as $v_2$. $v_2$ is demodulated by, for example, an envelope detector 40 to generate the signal $A_2$, the amplitude of the dither as sensed at the second dither stack 34. $A_2$ is fed to an amplitude controller 42 and a phase controller 44 to synthesize a complimentary dither drive signal $V_2 \cos (\omega_o t + \theta)$. The dither drive signal is tuned to maintain loop stability and to drive $A_2$ to 0.

The constants $K_{P11}$, $K_{P12}$, $K_{I21}$, $K_{I22}$ are tuned to maintain loop stability and to drive $A_2$ to zero.

A sine wave generator 46, a phase shifter 48, a pair of multipliers 50, and a DC voltage source 52 are also utilized in the synthesization of the complimentary dither drive signal and a reference signal $V_1 \cos \omega_o t$. The constructions of the motion sensor 36, the bandpass filter 38, the demodulator 40, the amplitude controller 42, the phase controller 44, the sine wave generator 46, the phase shifter 48, the pair of multipliers 50, and the DC voltage source 52 are all standard in the art.

Interconnected Mode

Figure 8:
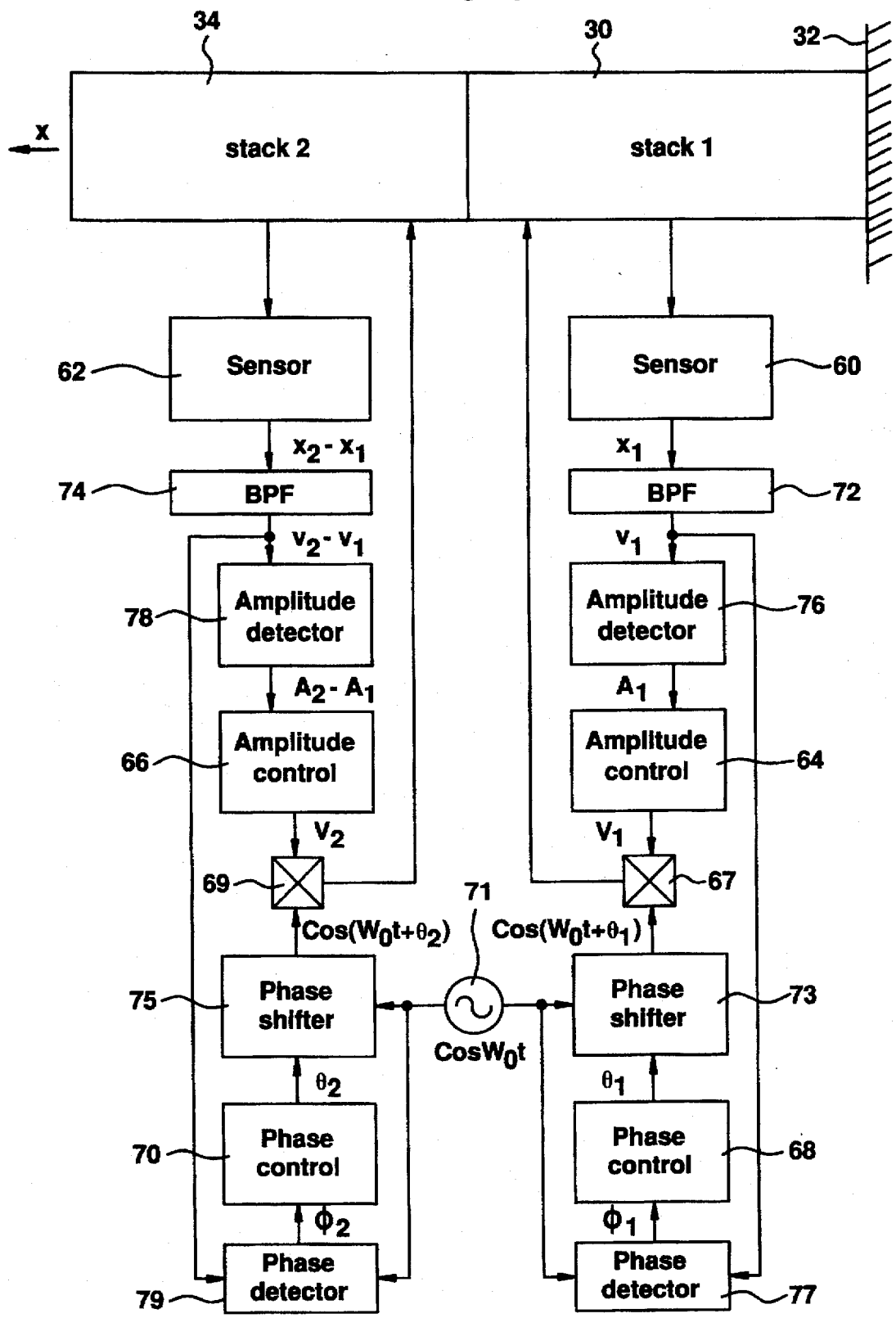
FIG. 8 is a schematic representation of an interconnected mode embodiment for controlling dither in a pair of adjoining stacks according to the present invention.

Referring to FIG. 8, the relative motions of both stacks 30 and 34 are actively regulated. The motion of the first stack 30 ($x_1$) is controlled to track a reference signal $A \cos \omega_o t$ while the motion of the second stack 34 ($x_2-x_1$) is controlled to track an inverted reference signal ($-A \cos \omega_o t$) so that the net dither motion appears to be zero at the load side ($x_2$). Sensors 60 and 62 are needed to measure $x_1$ and $x_2-x_1$, respectively. Generally, but not necessarily, amplitude controllers 64 and 66 and phase controllers 68 and 70 can be used.

The dither drive signal for the first stack 30 is synthesized by letting $r = A \cos \omega_o t$ represent the reference dither signal and letting $x_1$ denote the output of the first sensor 60, which measures the displacement of the first stack 30. $x_1$ is passed through a bandpass filter 72 at the dither frequency $\omega_o$ to produce $v_1$. $v_1$ is demodulated by an amplitude detector 76 to obtain $A_1$, the dither amplitude of the first stack 30, and by a phase detector 77 to obtain $\phi_1$, the dither phase of the first stack 30 relative to reference signal r. Any amplitude error may be represented by $e_1 = A_1 - A$, and the dither drive signal applied to the first stack is synthesized as $V_1 \cos$ ($\omega_o t + \theta_1$) by an amplitude controller 64, a phase controller 68, a phase shifter 73, and a multiplier 67. The constants $K_{P11}$, $K_{P12}$, $K_{I21}$, $K_{I22}$ are tuned to maintain loop stability and to drive $e_1$ and $\phi_1$ to zero. It should be noted that a sine wave generator 71 is also utilized in the synthesization of the dither drive signal.

The dither drive signal for the second stack 34 is synthesized in a manner similar to that of the dither drive signal for the first stack 30, except that they are 180° out of phase, through the use of a corresponding second sensor 62, a bandpass filter 74, an amplitude detector 78, a phase detector 79, an amplitude controller 66, a phase controller 70, a phase shifter 75, and a multiplier 69.

The constructions of the sensors 60 and 62, the bandpass filters 72 and 74, the amplitude detectors 76 and 78, the phase detectors 77 and 79, the amplitude controllers 64 and 66, the phase controllers 68 and 70, the phase shifters 73 and 75, the multipliers 67 and 69, and the sine wave generator 71 are all standard in the art.

In both the master-slave mode and the interconnected mode, about 100 volts (or, equivalently, 1 micron) of dither is needed to achieve a positioning accuracy of 0.1 micron. The dither frequency can be as high as 10 kHz with the limitation being the bandwidth of the drive circuitry and the mechanical resonances of the stacks.

Figure 9:
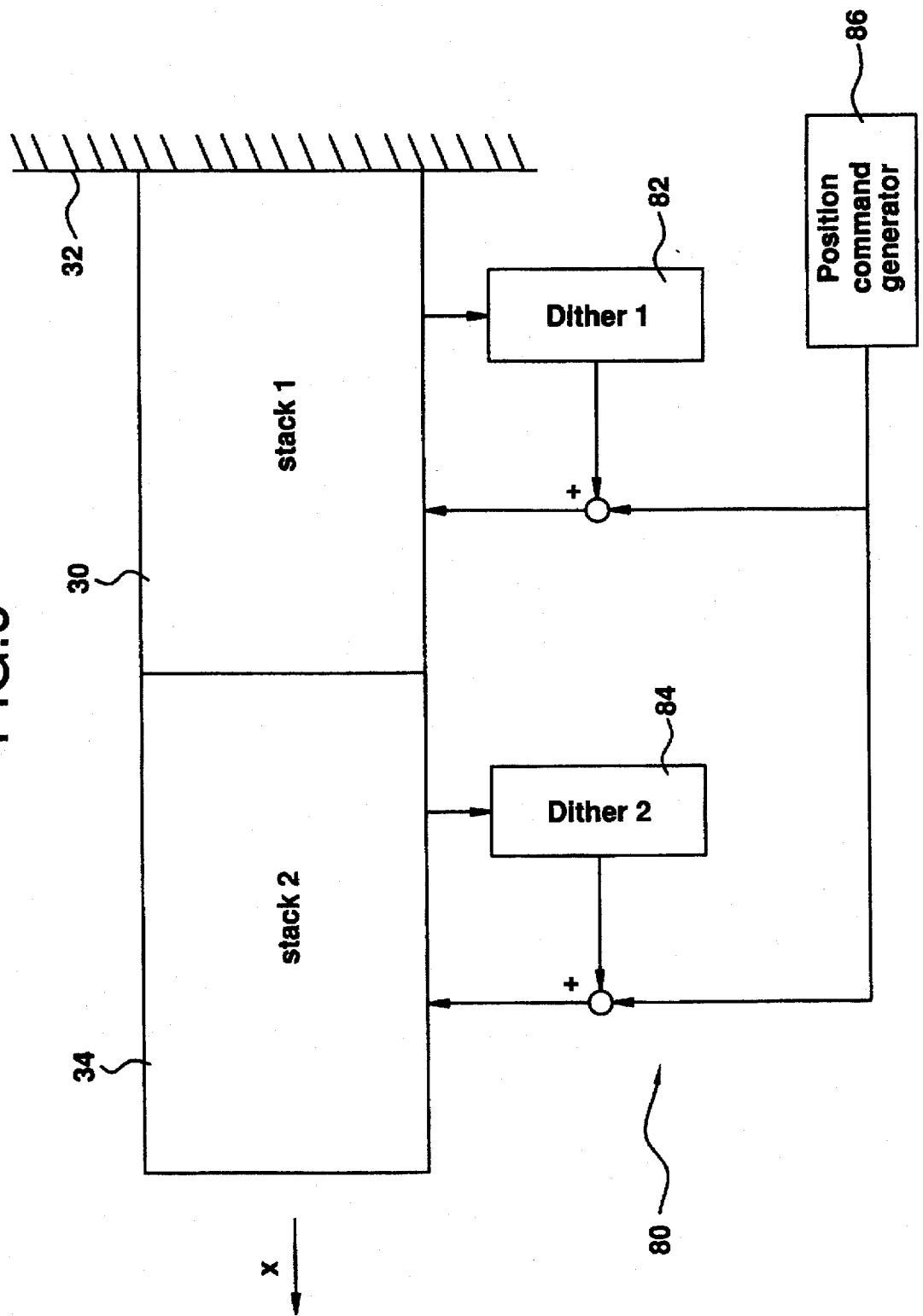
FIG. 9 is a schematic representation of an entire high accuracy piezoelectric positioning device according to the present invention.

Referring to FIG. 9, there is shown a schematic representation of an entire high accuracy piezoelectric positioning device 80 according to the present invention. The device 80 comprises a first piezoelectric stack 30 mounted to a support and a second piezoelectric stack 34 joined to the first piezoelectric stack 30. The device 80 also comprises first dithering means 82 for providing a dither signal to the first piezoelectric stack 30, and second dithering means 84 for providing a dither signal to the second piezoelectric stack 34. The dithering means 82 and 82 may be of the master-slave mode type or the interconnected mode type, or of another mode type that accomplishes the task of providing an intermediate dither so that no residual dither is transmitted to a load. The device 80 further comprises a position command signal generator 86 for providing a position command signal to both the first piezoelectric stack 30 and the second piezoelectric stack 34. The respective dither signals are added to the position command signal. Thus, the device 80 allows piezoelectric devices to be used for precise positioning purposes without having to endure the detrimental effects of hysteresis.

It should be noted that either stack 30 or 34 may be replaced by an electrical motor or other dithering body. In such a case, the remaining stack would be dithered so as to match the dither motion of the motor or other body.

It should also be noted that, although only sinusoidal dithering waveforms have been described herein, other periodic waveforms or even pseudo-random noise may be utilized to provide dithering motion to the piezoelectric stacks.

With the present invention high accuracy piezoelectric positioning device now fully described, it can thus be seen that the primary objective set forth above is efficiently attained and, since certain changes may be made in the above-described embodiments without departing from the scope of the invention, it is intended that all matter contained in the above description or shown in the accompanying drawings shall be interpreted as illustrative and not in a limiting sense.

What is claimed is:

1. A high accuracy piezoelectric positioning device that overcomes the detrimental effects of hysteresis, said device comprising:

a first stack of piezoelectric materials, said first stack of piezoelectric materials having a first end and a second end;

a second stack of piezoelectric materials, said second stack of piezoelectric materials having a first end and a second end, said first end of said second stack of piezoelectric materials being joined to said second end of said first stack of piezoelectric materials; and means for dithering said first stack of piezoelectric materials and said second stack of piezoelectric materials in a self-compensating, complementary manner so that hysteresis is virtually eliminated in said piezoelectric materials in said first and second stacks.

2. The high accuracy piezoelectric positioning device defined in claim 1, further comprising:

a support, said first end of said first stack of piezoelectric materials being mounted upon said support; and a load, said load being mounted upon said second end of said second stack of piezoelectric materials.

3. The high accuracy piezoelectric positioning device defined in claim 2, further comprising a drive means for providing said first stack of piezoelectric materials and said second stack of piezoelectric materials with a drive signal for precisely controlling the distance between said support and said load.

4. The high accuracy piezoelectric positioning device defined in claim 3, wherein said means for dithering said first stack of piezoelectric materials and said second stack of piezoelectric materials comprises dither circuit means for providing said first stack of piezoelectric materials with a first dithering signal and for providing said second stack of piezoelectric materials with a second dithering signal, wherein said first dithering signal and said drive signal are applied to said first stack of piezoelectric materials and said second dithering signal and said drive signal are applied to said second stack of piezoelectric materials so that the distance between said support and said load is not affected by residual dither.

5. The high accuracy piezoelectric positioning device defined in claim 4, wherein said first dithering signal and said second dithering signal are high frequency signals.

6. The high accuracy piezoelectric positioning device defined in claim 4, wherein said first dithering signal and said second dithering signal are low amplitude signals.

7. The high accuracy piezoelectric positioning device defined in claim 4, wherein said drive signal is a low frequency signal.

8. The high accuracy piezoelectric positioning device defined in claim 4, wherein said drive signal is a high amplitude signal.

9. The high accuracy piezoelectric positioning device defined in claim 1, wherein said first stack of piezoelectric materials and said second stack of piezoelectric materials each comprise a plurality of discs of piezoelectric material each having a first and a second conductive electrode formed on a first and a second surface thereof, respectively, and each being separated from one other by a nonconductive adhesive.

10. The high accuracy piezoelectric positioning device defined in claim 1, wherein said piezoelectric materials are lead zirconate—lead titanate (PZT).

11. A high accuracy piezoelectric positioning device that overcomes the detrimental effects of hysteresis, said device comprising:

a stack of piezoelectric materials, said stack of piezoelectric materials having a first end and a second end;

a dithering body, said dithering body having a first end and a second end, said first end of said dithering body being joined to said second end of said stack of piezoelectric materials; and means for dithering said stack of piezoelectric materials in a complementary manner with the dithering of said dithering body so as to compensate for the dithering of said dithering body and thereby virtually eliminate hysteresis in said piezoelectric materials in said stack, wherein any movement of the first end of said stack due either to dithering of the dithering body or to dithering of the stack is substantially eliminated.

12. A high accuracy piezoelectric positioning device that overcomes the detrimental effects of hysteresis, said device comprising:

a stack of piezoelectric materials, said stack of piezoelectric materials having a first end and a second end;

a dithering body, said dithering body having a first end and a second end, said first end of said dithering body being joined to said second end of said stack of piezoelectric materials;

means for dithering said stack of piezoelectric materials in a complementary manner with the dithering of said dithering body so as to compensate for the dithering of said dithering body and thereby virtually eliminate hysteresis in said piezoelectric materials in said stack;

a support, said first end of said stack of piezoelectric materials being mounted upon said support; and a load, said load being mounted upon said second end of said dithering body.

13. The high accuracy piezoelectric positioning device defined in claim 12, further comprising a drive means for providing said stack of piezoelectric materials with a drive signal for precisely controlling the distance between said support and said load.

14. The high accuracy piezoelectric positioning device defined in claim 13, wherein said means for dithering said stack of piezoelectric materials comprises dither circuit means for providing said stack of piezoelectric materials with a dithering signal, wherein said dithering signal and said drive signal are applied to said stack of piezoelectric materials so that the distance between said support and said load is not affected by residual dither.

15. The high accuracy piezoelectric positioning device defined in claim 14, wherein said dithering signal is a high frequency signal.

16. The high accuracy piezoelectric positioning device defined in claim 14, wherein said dithering signal is a low amplitude signal.

17. The high accuracy piezoelectric positioning device defined in claim 14, wherein said drive signal is a low frequency signal.

18. The high accuracy piezoelectric positioning device defined in claim 14, wherein said drive signal is a high amplitude signal.

19. The high accuracy piezoelectric positioning device defined in claim 11, wherein said stack of piezoelectric materials comprises a plurality of discs of piezoelectric material each having a first and a second conductive electrode formed on a first and a second surface thereof, respectively, and each being separated from one other by a nonconductive adhesive.

20. The high accuracy piezoelectric positioning device defined in claim 11, wherein said piezoelectric materials are lead zirconate—lead titanate (PZT).

21. A method for obtaining high accuracy positioning using piezoelectric devices, said method overcoming the detrimental effects of hysteresis, said method comprising the steps of:

dithering a first stack of piezoelectric materials and a second stack of piezoelectric materials in a self-compensating, complementary manner so that hysteresis is virtually eliminated in said piezoelectric materials in said first and second stacks, said first stack of piezoelectric materials and said second stack of piezoelectric materials being joined together between a support and a load; and applying a drive signal to both said first stack of piezoelectric materials and said second stack of piezoelectric materials so as to precisely control the distance between said support and said load.

22. A method for obtaining high accuracy positioning using piezoelectric devices, said method overcoming the detrimental effects of hysteresis, said method comprising the steps of:

joining together a dithering body and a stack of piezoelectric materials between a support and a load;

dithering said stack of piezoelectric materials in a complementary manner with the dithering of said dithering body so as to compensate for the dithering of said dithering body and thereby virtually eliminate hysteresis in said piezoelectric materials in said stack; and applying a drive signal to said stack of piezoelectric materials so as to precisely control the distance between said support and said load.

23. The high accuracy piezoelectric positioning device defined in claim 11 wherein said dithering body is nonpiezoelectric.

24. A high accuracy piezoelectric positioning device for use with a dithering body, said device comprising:

a stack of piezoelectric materials, said stack having a first end and a second end, wherein said first end of said dithering body is joined to said stack; and means for dithering said stack of piezoelectric materials in a complementary manner with the dithering of said dithering body so as to compensate for the dithering of said dithering body and thereby virtually eliminate hysteresis in said piezoelectric materials in said stack, wherein any movement of the first end of said stack due either to dithering of the dithering body or to dithering of the stack is substantially eliminated.

25. A method for obtaining high accuracy positioning using piezoelectric devices, said method overcoming the detrimental effects of hysteresis, said method comprising the steps of:

dithering a first stack of piezoelectric materials and a second stack of piezoelectric materials in a self-compensating, complementary manner so that hysteresis is virtually eliminated in said piezoelectric materials in said first and second stacks, said first stack of piezoelectric materials and said second stack of piezoelectric materials being joined together thereby forming two opposite ends; and applying a drive signal to both said first stack of piezoelectric materials and said second stack of piezoelectric materials so as to precisely control the distance between the two opposite ends.

26. A method for obtaining high accuracy positioning using piezoelectric devices, said method overcoming the detrimental effects of hysteresis, said method comprising the steps of:

joining together a dithering body and stack of piezoelectric materials, wherein said dithering body is joined to a proximal end of said stack;

dithering said stack of piezoelectric materials in a complementary manner with the dithering of said dithering body so as to compensate for the dithering of said dithering body and thereby virtually eliminate hysteresis in said piezoelectric materials in said stack; and applying a drive signal to said stack of piezoelectric materials so as to precisely control the position of a distal end of said stack opposite said proximal end.

* * * * *